(12) United States Patent
Rinzler

(10) Patent No.: US 8,049,106 B2
(45) Date of Patent: Nov. 1, 2011

(54) METHOD FOR FORMING INTERPENETRATING NETWORKS OF DISTINCT MATERIALS AND DEVICES THEREFROM

(75) Inventor: Andrew Gabriel Rinzler, Newberry, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 706 days.

(21) Appl. No.: 12/093,999

(22) PCT Filed: Nov. 21, 2006

(86) PCT No.: PCT/US2006/045118
§ 371 (c)(1),
(2), (4) Date: May 16, 2008

(87) PCT Pub. No.: WO2007/062072
PCT Pub. Date: May 31, 2007

(65) Prior Publication Data
US 2008/0236660 A1    Oct. 2, 2008

Related U.S. Application Data

(60) Provisional application No. 60/738,462, filed on Nov. 21, 2005.

(51) Int. Cl.
*H01L 31/00* (2006.01)
(52) U.S. Cl. ........... 136/263; 136/252; 428/411.1; 428/316.6; 427/372.2; 427/243
(58) Field of Classification Search .............. None
See application file for complete search history.

(56) References Cited

U.S. PATENT DOCUMENTS

| 2004/0084080 A1* | 5/2004 | Sager et al. ............... 136/263 |
| 2004/0197546 A1 | 10/2004 | Rinzler et al. |
| 2005/0064185 A1 | 3/2005 | Buretea et al. |
| 2007/0169814 A1* | 7/2007 | Huck et al. ............... 136/263 |

FOREIGN PATENT DOCUMENTS

| WO | WO 96-16449 | 5/1996 |
| WO | WO 2004-009884 | 1/2004 |

OTHER PUBLICATIONS

Halls, J. J. M., et al., "Efficient photodiodes from interpenetrating polymer networks," *Nature*, Aug. 1995, pp. 498-500, vol. 376, No. 10, Nature Publishing Group, London, GB.

Zhang, X., et al., "$Al_2O_3$-coated nanoporous $TiO_2$ electrode for solid-state dye-sensitized solar cell," *Solar Energy Materials and Solar Cells*, Nov. 2003, pp. 315-326, vol. 80, No. 3, Elsevier Science Publishers, Amsterdam, NL.

* cited by examiner

*Primary Examiner* — Jennifer K. Michener
*Assistant Examiner* — Magali P Slawski
(74) *Attorney, Agent, or Firm* — Saliwanchik, Lloyd & Eisenschenk

(57) ABSTRACT

An electrical or electro-optical device (100) includes a first layer (110) having a first composition. The first composition includes a plurality of electrically connected particles. A second layer (130) has a second composition, the second composition including a plurality of electrically connected particles. A composite layer (120) is disposed between the first and second layer. The composite layer is an interpenetrated network of a third and a fourth composition, wherein the third composition is different from the fourth composition. A first electrically interconnected network extends from the first composition in the first layer (110) to the third composition throughout a thickness of the composite layer (120), and a second electrically interconnected network extends from the second composition in the second layer (130) to the fourth composition throughout the thickness of the composite layer.

11 Claims, 1 Drawing Sheet

METHOD FOR FORMING INTERPENETRATING NETWORKS OF DISTINCT MATERIALS AND DEVICES THEREFROM

CROSS-REFERENCE TO RELATED APPLICATIONS

This application is the U.S. national stage application of International Patent Application No. PCT/US2006/045118, filed Nov. 21, 2006, which claims the benefit of U.S. Provisional Patent Application Ser. No. 60/738,462, filed Nov. 21, 2005, the disclosures of which are incorporated by reference herein in their entirety, including any figures, tables, or drawings.

FIELD OF THE INVENTION

The present invention relates to methods for forming interpenetrating networks of distinct materials and devices therefrom.

BACKGROUND OF THE INVENTION

The contact area between a first and a second material is known to significantly impact the performance of a variety of electrical and electrical and electro-optical devices. Although easy to fabricate, conventional, substantially planar contacts generally minimize the contact area. For example, in solar cells, the charge separation responsible for generating useful power occurs only for that fraction of the incident light that is absorbed in the region of the built in potential, near the interface between two distinct materials (e.g. an n and p type semiconductor for a homo-junction or distinct semiconductors for hetero-junctions). Increasing that surface area of contact will extend the volume over which the absorbed light generates useful power, hence more efficiently utilizing the incident radiation. In a light emitting diode the light emission typically occurs at the junction between two distinct materials where electrons injected from one side and holes from the other radiatively combine. Here, increasing the surface area of contact can result in more light output from the device.

When electrical contact must be made to a semiconductor for the purpose of charge injection or extraction, contact barriers frequently arise between the semiconductor and the electrical conductor used to make the electrical contact. Simply increasing the surface area of contact can increase the net amount of current injected/extracted. Accordingly, a method for forming high contact area interfaces, including semiconducting junction comprising devices, would be highly desirable.

BRIEF DESCRIPTION OF THE DRAWINGS

A fuller understanding of the present invention and the features and benefits thereof will be obtained upon review of the following detailed description together with the accompanying drawings, in which.

SUMMARY

Figure 1:
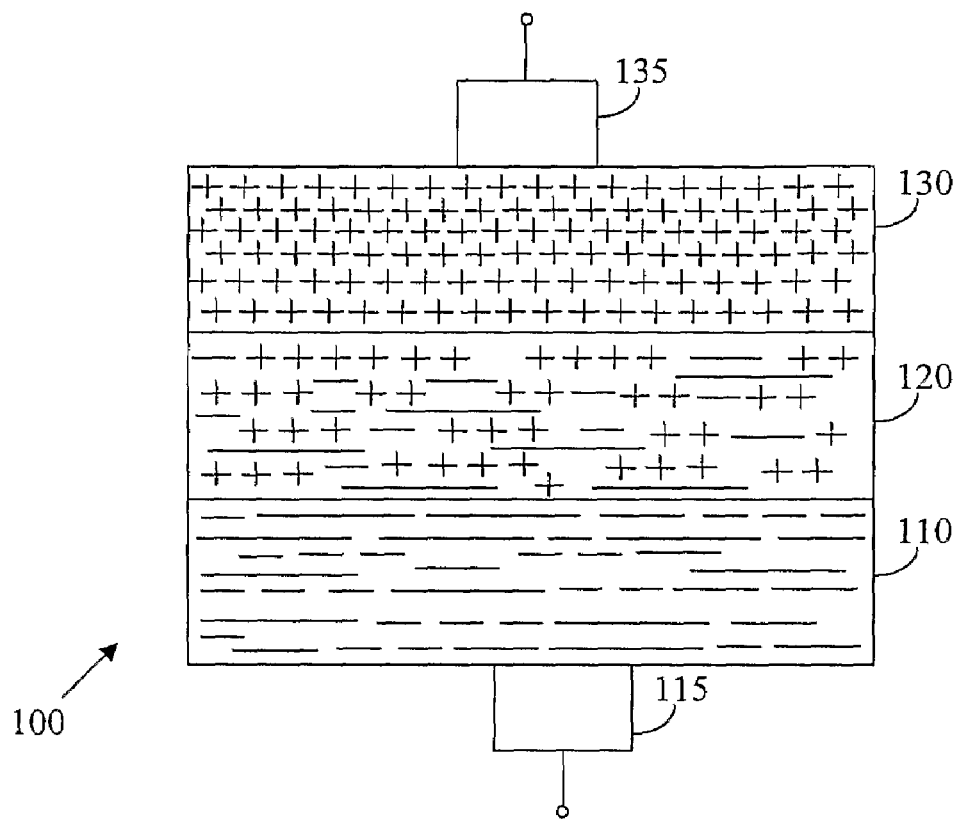
FIG. 1 is a schematic cross-sectional view of an exemplary high efficiency diode which includes a composite layer interposed between a first layer material comprising a first composition and a second layer material comprising a second composition, according to an embodiment of the invention. The composite layer comprises a mixture of the first and second composition which provides a large surface area of contact between the respective materials.

An electrical or electro-optic device comprises a first layer comprising a first composition. The first composition comprises a plurality of electrically connected particles. A second layer comprises a second composition, the second composition comprising a plurality of electrically connected particles. A composite layer is disposed between the first and the second layer. The composite layer comprises an interpenetrated network of a third and a fourth composition, wherein the third composition is different from the fourth composition. A first electrically interconnected network extends from the first composition in the first layer to the third composition throughout a thickness of the composite layer, and a second electrically interconnected network extends from the second composition in the second layer to the fourth composition throughout the thickness of the composite layer.

In one embodiment at least one of the compositions comprises nanotubes, nanowires, or nanoparticles. In this embodiment, the first layer, the second layer, and the composite layer comprise nanowires, wherein the nanowires are preferentially oriented to generally lie along a plane.

At least one of the first, second, and the composite layers are porous layers. In this embodiment, a polymeric continuous phase can infiltrate the porous layer.

A concentration of the third and fourth composition in the composite layer can be stepwise graded. The second composition can be different from the first composition. In another embodiment, the first composition and the third composition can be the same and the second and fourth compositions can be the same. In another embodiment, one of the third and fourth composition comprises a p-type semiconductor and the other can comprise an n-type semiconductor.

The device can comprise a solar cell or a light emitting diode (LED). The device can comprise a multi-component heterojunction structure, wherein the first layer, second layer, and composite layer comprise different compositions. In the multi-component heterojunction embodiment, the composite layer can either develops a built-in potential for charge separation for photovoltaic applications or comprise a light emitting device.

A method of forming a layer stack for an electronic or an electro-optical device, comprises the steps of
(a) providing a porous membrane;
(b) dispersing a plurality of nanotubes, nanowires or nanoparticles of a first composition in a solution;
(c) applying the solution to the membrane, and
(d) removing the solution, wherein the nanotubes, nanowires or nanoparticles are forced onto a surface of the porous membrane to form a first composition comprising layer disposed on the membrane;

Steps (b)-(d) are repeated using a plurality of nanotubes, nanowires or nanoparticles of a second and third composition, wherein composite layer comprising an interpenetrated network of the second and third composition is formed on first composition comprising layer. Steps (b)-(d) are then repeated using a plurality of nanotubes, nanowires or nanoparticles of a fourth composition to form a fourth composition comprising film layer formed on the composite layer.

One of the second and third composition can comprise a p-type semiconductor and the other of the second and third composition can comprise an n-type semiconductor. The device can includes a substrate, the method further comprising the steps of placing the layer stack on the substrate, and selectively removing the membrane. The first, second and composite layers can all be porous layers. The method can further comprise the step of infiltrating at least one of said porous layers with a polymeric material.

DETAILED DESCRIPTION

An electrical or electro-optical device comprises a first layer comprising a first composition. The first composition comprises a plurality of electrically connected particles. A second layer comprises a second composition, the second composition comprising a plurality of electrically connected particles. A composite layer is disposed between the first and the second layer. The composite layer comprises an interpenetrated network of a third and a fourth composition, wherein the third composition is different from the fourth composition. A first electrically interconnected network extends from the first composition in the first layer to the third composition throughout a thickness of the composite layer, and a second electrically interconnected network extends from the second composition in the second layer to the fourth composition throughout the thickness of the composite layer.

At least one of the compositions generally comprise nanotubes, nanowires, or nanoparticles. The compositions can include organics or inorganics, mixed organics and inorganics, and may include polymers. The compositions may provide metallic or semiconducting properties.

A nanowire is a wire having a diameter of the order of 0.5 to several hundred nanometers ($10^{-9}$ meters), but typically less than a micron. Alternatively, nanowires can be defined as structures that have a lateral size constrained to hundreds of nanometers, or less, and an unconstrained longitudinal size. A variety of nanowires exist, including metallic (e.g., Ni, Pt, Au), semiconducting (e.g., InP, Si, GaN). Typical nanowires exhibit aspect ratios (the ratio between length to width) of 11 to 1,000 (or more).

The interpenetrated composite layer provides a large surface area of contact between the respective third and fourth compositions, such as compared to a conventional planar contact. As used herein, compositions are considered different based on differences in chemistries, crystal types, and/or doping. Thus, for example, n-type silicon is considered herein to be a different composition as compared to p-type silicon.

As used herein, an "interpenetrated network" of dissimilar materials can be defined by considering a structure comprising two distinct materials, A and B, described in this paragraph. Material A is electrically contiguous from point to point but with a porous morphology in which the pores are also contiguous (like the pores in an open cell foam). Those pores are filled with material B in which material B is also electrically contiguous from point to point. Materials A and B thus constitute an interpenetrated network of dissimilar materials.

Most generally, the first, second, third and fourth materials are all different compositions. The significant features are that the first and third composition, as well as the second and fourth composition, couple well electronically. In one embodiment, the first and third compositions are the same, as well as the second and fourth compositions. In this embodiment, the first substantially interconnected network comprising the first composition extends from the first layer throughout a thickness of the composite layer, and the second substantially interconnected network comprising the second composition extends from the second layer throughout the thickness of said composite layer.

FIG. 1 is a schematic cross-sectional view of an exemplary high efficiency diode 100 according to one embodiment of the invention. First layer 110 comprising a first composition, such as an n-doped semiconducting nanowire material is provided. Electrical contact to first layer 110 is provided by contact layer 115, which may comprise as metal. An n+ region in second layer 130 adjacent to contact 135 which may be required for a low resistance contact is not shown. The n-nanowires are each shown as a thin solid lines. Second layer 130 comprises a second (different) composition, such as a p-doped semiconducting material, which is disposed above first layer 110. The p-nanowires are shown as "+" signs. Electrical contact to second layer 130 is provided by contact layer 135, which may comprise as metal.

A composite layer 120 is interposed between the first layer 110 and second layer 130. The composite layer 120 comprises a mixture of the first and second composition which provides a large surface area of contact between the respective n and p type materials. A first substantially interconnected network comprising the n-type material is seen extending from the first layer 110 throughout a thickness of the composite layer 120 and a second substantially interconnected network comprising the p-material extends from the second layer 130 throughout the thickness of the composite layer 120.

A general method is also described herein for fabricating interpenetrated networks of distinct materials that possess a high surface area of contact between the distinct materials. Such interpenetrated network materials will have broad applications, such as for photovoltaic and photoemissive devices.

The present invention preferably utilizes the methods disclosed in Published U.S. Application No. 20040197546 ('546) to Rinzler et al., Rinzler being the present Inventor, entitled "Transparent electrodes from single wall carbon nanotubes". '546 discloses a low temperature method of forming substantially optically transparent and electrically conductive single wall nanotube (SWNT) films. '546 discloses uniformly suspending single-wall nanotubes (SWNTs) in solution generally aided by a stabilizing agent (e.g. surfactant) followed by the deposition of the nanotubes onto the surface of a porous filtration membrane that possesses a high density of pores that are too small for the majority of the SWNTs to pass through. The nanotube film forms as an interconnected and uniform layer having the SWNTs generally lying on and being roughly parallel to the membrane surface as the liquid is filtered away.

Although generally applied to nanotubes, the method described in '546 can be extended to the deposition of materials other than nanotubes so long as 1) the material constituents can be uniformly suspended in a solution, 2) the liquid does not react with the selected filtration membrane material but passes through it, 3) the material constituents are retained on the membrane surface in the form of a film, and 4) the filtration membrane can be dissolved in solvent that does not dissolve the desired film, or the substrate, to which the film is to be transferred. For example, this method can also fabricate nanotube, nanoparticle and nanowire comprising thin films.

In one '546 disclosed embodiment, the solution is vacuum filtered off, with the remaining SWNT film formed on the filter membrane surface. Any remaining surface stabilizing agent can be subsequently washed away and the film can then be allowed to dry. Significantly, the washing away of the stabilizing agents used to suspend the nanotubes permits the nanotubes to achieve intimate contact with each other (consolidated) throughout the body of the SWNT film. The nanotube film formed in this manner has one side intimately attached to the filtration membrane while the other side is uncoated. To make use of the film, it is generally necessary for the film be transferred to the desired substrate and to remove the membrane. This is accomplished by first adhering the free side of the nanotube film to the clean, desired substrate e.g. by pressure, followed by dissolution of the filtration membrane in a solvent in which the membrane is soluble.

The membrane material thus should be carefully selected. The membrane should tolerate the liquid in which the nanotubes are originally suspended, however the membrane should be soluble in a solvent to be removed that, ideally, does not chemically react with the substrate to which the SWNT film is to be attached. Dissolution of the membrane in this solvent leaves the nanotube film attached to the surface of the substrate.

To clarify the invention, an example is provided. Consider two separate suspensions of p and n doped silicon nanowires in a fluid wherein the two suspensions contain equal concentrations of nanowires. A third suspension is made consisting of equal mixtures of the two original suspensions obtaining a suspension consisting of a 50/50 mixture of the two types of nanowires. To fabricate the interpenetrating network, the pure p-type nanowires are first deposited onto the surface of a filtration membrane that allows the fluid to penetrate while retaining the nanowires on the surface of the membrane as a thin film. The film is then dried or allowed to dry, which consolidates the nanowires placing them in intimate physical contact with other nanowires in the film. This is followed by depositing the 50/50 mixture on top of the pure p-type layer, which is also allowed to dry. Finally the pure n-type layer is deposited in the same fashion. The three layer structure produced comprises (from bottom to top) p-type silicon, an interpenetrating network including both p and n type silicon, and finally n-type silicon on top. It is noted that the n-type nanowires constitute an electrically connected network that extends from the pure n-layer into and throughout the composite layer. The p-type nanowires similarly constitute an electrically connected network that extends from the pure p-layer into and throughout the mixed composite layer. The resulting structure is thus two intimately mixed, interpenetrating networks of two distinct materials, in intimate electrical contact with each other. Because of the large surface area of contact between the p and n type silicon nanowires in the central layer this forms the basis for a high efficiency solar cell, capable of absorbing more of the incident radiation than is possible at the single planar interface of the typical flat interface device.

Figure 2:
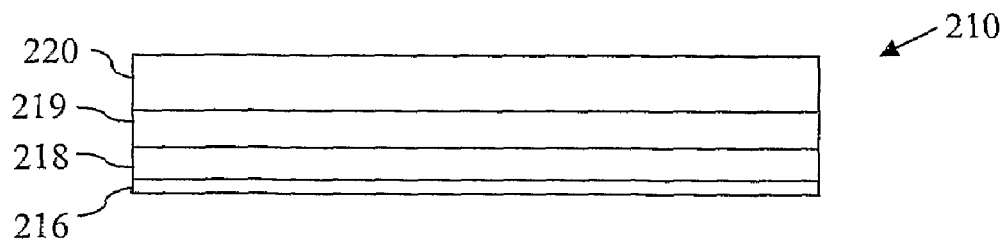
FIG. 2 shows a cross sectional view of an exemplary gallium arsenide solar cell according to one embodiment the invention.

FIG. 2 shows an exemplary embodiment of the invention, comprising a gallium arsenide solar cell 210. An exemplary method to form the solar cell 210 is described in paragraph 27 below (beginning with "To form a device on a crystalline or polycrystalline wafer"). A layer 216 of p-type gallium arsenide is the bottom-most layer. The electrical characteristics and thickness of the layer 216 are chosen to provide optimal performance of the solar cell 210. Preferably, the p-type gallium arsenide has a thickness of about 0.5 micrometers, or less. An interpenetrated layer 218 comprising n-type and p-type gallium arsenide is on top of the layer 216 of p-type gallium arsenide. The electrical characteristics and thickness of the layer 218 are chosen to optimize performance of the solar cell. The n-type gallium arsenide of the layer 218 preferably has thickness of about 10 to 20 micrometers. A layer 219 of n-type gallium arsenide is on top of interpenetrated layer 218. A transparent cover 220 is attached to the upper surface of the layer 219. The composition and thickness of the transparent cover 220 are selected to optimize the electrical performance of the solar cell 210. Preferably, the transparent cover 220 is a silica glass, having a thickness of several hundred micrometers. The transparent cover 220 performs several functions. First, the cover 220 allows light to pass through to the layers 216, 218 and 219. Second, the cover 220 supports the remaining elements of the solar cell 210. Third, the cover 220 protects the remaining elements from physical damage. External contacts to layers 216 and 219 are also provided (not shown in FIG. 2).

Such a device can also form the basis for a high power density diode, where the large interface provided by an interpenetrated layer p-n junction comprising layer such as 218 described relative to solar cell 210 would permit larger power dissipation, over the greater volume, without deleterious thermal consequences to the device.

The invention also applies to devices formed from direct bandgap semiconductor nanowires (e.g. GaAs, or GaN). A homo-junction LED according to the invention can be realized by disposing an interpenetrated p and n-doped GaAs layer between a p-doped GaAs and n-doped GaAs. Such LEDs will emit more light (at higher injected currents) than is possible with typical planar interface devices. The base semiconductor material of the constituents forming the composite layer need not be the same, also allowing the fabrication of heterojunction devices.

As noted above, the composite layer (e.g. mixed semiconducting nanowire, or nanoparticle or combination nanowire/nanoparticle) need not be the same as the compositions in the first and second layer that sandwich the composite layer. Instead of being semiconducting, one component of the composite layer can be metallic (e.g. nanotubes).

Moreover, the unmixed pure layers need not themselves be nanowires or nanoparticles. For example for photovoltaic or photo-emissive devices one side can be a single or polycrystalline wafer, doped appropriately to couple well electronically to the first of the nanowire/nanoparticle constituents of the composite layer, while (electronically) coupling poorly to the second of the composite constituents. Electrical coupling here refers to the barriers to electrical transport that naturally occur at the junctions between dissimilar materials. Coupling well means a sufficiently low barrier to permit electrical transport across the junction (to a degree sufficient for the device performance). Coupling poorly means a sufficiently high barrier to electrical transport across the junction such that transport is effectively prevented via this route (to the degree sufficient for the device performance).

To form a device on a crystalline or polycrystalline wafer the composite layer formed on the filtration membrane can be transferred to this wafer (the membrane is dissolved away), followed by deposition of a layer of indium tin oxide (ITO) on top of the mixed composite layer as the electrode for charge injection or extraction (depending on the device type). The ITO here must electrically couple well to the second constituent (C) while coupling poorly to the first (B). Alternatively, instead of an ITO top electrode, which ends up as the top, a transparent electrode contact can be a thin nanotube layer that is deposited on the filtration membrane first. The mixed composite layer is then deposited on top of the nanotube film by the same filtration process. When these are transferred to the single or polycrystalline substrate, with the mixed composite layer contacting the substrate, and the membrane is dissolved away, the nanotube layer becomes the optically transparent top electrode for the charge injection/extraction.

In fabricating such devices if rather than making a single 50/50 mixture for the middle layer, the ratio of the fluid volume from each of the original suspensions is varied (while maintaining the same total volume) for several mixtures, then a sequence of suspensions in which the concentration of the two types of nanowires will proceed stepwise from a high concentration of one type, to a high concentration of the other in an arbitrary number of steps. The network concentration of n type can then be stepwise graded at the expense of the p-type concentration in going across the thickness of the device. By using a large number of steps the change in concentration can be made virtually continuous.

The inventive method is not limited to p-n junctions, nor to three types of material layers. For example, successive depositions onto the same filtration membrane can be used to build devices according to the invention. For example, if the first material consists of metallic nanowires (or carbon nanotubes) this can be followed by a mixture of metallic and semiconducting nanowires, followed by the pure semiconducting nanowires. Such a structure would permit the high power density coupling of charge into or out of the semiconducting nanowire layer by virtue of the large surface area of electrical contact. A multilayer device can comprise 1) a pure carbon nanotube layer, 2) a mixed nanotube/p-type nanowire layer, 3) a pure p-type nanowire layer 4) a mixed p-type/n-type nanowire layer 5) a pure n-type nanowire layer 6) a mixed n-type nanowire/carbon nanotube layer, or 7) a pure carbon nanotube layer.

The morphology of the nanowire films by virtue of their porosity moreover permits high surface area contact to metallic layers simply by common metal deposition processes. For example thermal or e-beam evaporation, sputtering, or even electrodeposition can be used to contact a deposited metal layer onto a film according to the invention.

This fabrication strategy is not limited to the use of nanowires, but can also be employed with nanoparticles to provide graded interfaces of nanoparticles with nanoparticles or nanoparticles with nanowires. Such resulting layers are generally porous and non-aligned. In the case of weak binding between the nanowires or nanoparticles the device can be given structural integrity by infiltrating with a polymer. If such infiltration is done after the consolidation of the layers that occurs upon drying, the intimate electrical contact between the nanowires/nanoparticles will not be disrupted.

Such polymer infiltration of the films need not be only for the purpose of enhancing the structural integrity but could also serve other functionality of the device. For example the polymer may itself be a p-type semiconductor that forms a built in potential with n-type semiconducting nanowires, for photovoltaic power generation.

If the materials of interest for forming interpenetrating networks do not exist as nanowires or nanoparticles but can be coated onto other nanowires (or nanoparticles) then so coated nanowires can be used in the fabrication.

For applications it will often be necessary that the deposited film structure be transferred to substrates other than the filtration membrane onto which the layers were deposited. This can be accomplished by the methods for transfer disclosed in '546.

The foregoing examples have described deposition of layers (pure or mixed) and their transfer via the methods disclosed in '546. However, the present invention includes methods other than those disclosed in '546 to form devices. For example nanowires of material "A" may be spray coated on a surface that has provisions for electrical contact to the material (e.g. via a metallic layer on the surface or metallic electrodes across the surface) and the solvent allowed to evaporate. Next a layer of mixed nanowires of material "A" and material "B" can be spray coated onto the first material layer comprising the interpenetrated network and the solvent from that layer allowed to evaporate. Subsequently a pure layer of material "B" nanowires can be spray coated onto the mixed layer and its solvent allowed to evaporate. Finally electrical contact can be made to the top layer by deposition of a top electrode layer.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

The invention claimed is:

1. A solar cell comprising an active layer, the active layer comprising:
   a first layer comprising a first composition;
   a second layer comprising a second composition; and
   a composite layer disposed between said first and said second layer, said composite layer comprising an interpenetrated network of a third composition and a fourth composition, wherein the third composition extends from said first layer to said second layer throughout a thickness of said composite layer, and said fourth composition extends from said second layer to said first layer through said third composition throughout said thickness of said composite layer, wherein at least one of said third composition and said fourth composition comprises a plurality of semiconducting nanowires, wherein said semiconducting nanowires comprise InP, Si, GaAs or GaN.

2. The device of claim 1, wherein said third composition and said fourth composition comprise nanowires, wherein said third composition differs from said fourth composition.

3. The device of claim 2, wherein said composite layer comprises nanowires that are interpenetrated and lie across one another on said first layer or on said second layer.

4. The device of claim 1, wherein at least one of said first layer, said second layer, and said composite layer is a porous layer.

5. The device of claim 1, further comprising a polymeric continuous phase infiltrating one or more of said layers comprising a plurality of nanowires.

6. The device of claim 1, wherein a concentration of said third and said fourth composition in said composite layer is stepwise graded.

7. The device of claim 1, wherein said second composition is different from said first composition.

8. The device of claim 1, wherein said first composition and said third composition are the same and said second and said fourth composition are the same.

9. The device of claim 1, wherein one of said third and fourth composition comprises a p-type semiconductor and the other of said third and fourth composition comprises an n-type semiconductor.

10. The device of claim 1, wherein said device comprises a multi-component heterojunction structure, wherein said first layer, said second layer, and said composite layer comprise different compositions.

11. The device of claim 10, wherein said composite layer develops a built-in potential for charge separation for photovoltaic applications.

* * * * *

UNITED STATES PATENT AND TRADEMARK OFFICE
CERTIFICATE OF CORRECTION

| | |
|---|---|
| PATENT NO. | : 8,049,106 B2 |
| APPLICATION NO. | : 12/093999 |
| DATED | : November 1, 2011 |
| INVENTOR(S) | : Rinzler |

It is certified that error appears in the above-identified patent and that said Letters Patent is hereby corrected as shown below:

<u>Column 1,</u>
Line 28, "electrical and electrical and electro-optical" should read --electrical and electro-optical--.

<u>Column 2,</u>
Line 2, "embodiment the" should read --embodiment of the--.
Line 43, "can either develops a" should read --can either develop a--.
Line 67, "can includes a substrate" should read --can include a substrate--.

<u>Column 3,</u>
Lines 37-38, "of 11 to 1,000" should read --of 10 to 1,000--.

<u>Column 4,</u>
Line 6, "comprise as metal" should read --comprise a metal--.
Line 9, "shown as a thin solid lines" should read --shown as a thin solid line--.
Line 14, "comprise as metal" should read --comprise a metal--.

<u>Column 6,</u>
Line 31, "devices one side" should read --devices, one side--.

<u>Column 7,</u>
Line 42, "built in potential" should read --built-in potential--.

<u>Column 8,</u>
Lines 8-9, "the foregoing description as well as the examples which follow are intended"
should read --the foregoing description is intended--.

Signed and Sealed this
Tenth Day of January, 2012

David J. Kappos
*Director of the United States Patent and Trademark Office*